United States Patent
Chao et al.

(10) Patent No.: US 6,468,813 B1
(45) Date of Patent: Oct. 22, 2002

(54) METHOD OF AUTOMATICALLY IDENTIFYING AND SKIPPING DEFECTIVE WORK PIECES FOR WIRE-BONDING OPERATION

(75) Inventors: Te Tsung Chao, Kaohsiung (TW); Hui Chin Fang, Kaohsiung (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 0 days.

(21) Appl. No.: 09/561,905

(22) Filed: May 1, 2000

(51) Int. Cl.$^7$ .................. H01L 21/00; H01L 23/495; H01L 21/48
(52) U.S. Cl. .............. 438/7; 438/106; 257/676
(58) Field of Search ............... 438/7, 15, 121, 438/123, 125, 126, 16, 111, 106; 257/666, 668, 676; 361/820

(56) References Cited

U.S. PATENT DOCUMENTS 4,441,205 A     4/1984  Berkin et al.
6,048,755 A  *  4/2000  Jiang et al. .............. 438/118
6,187,121 B1 *  2/2001  Hong et al. ................ 156/64

FOREIGN PATENT DOCUMENTS

JP          5-267449 A  *  5/1993  .......... H01L/21/78

* cited by examiner

*Primary Examiner*—Michael Sherry
*Assistant Examiner*—Evan Pert
(74) *Attorney, Agent, or Firm*—Stevens, Davis, Miller & Mosher, LLP

(57) ABSTRACT

A method of automatic identifying and skipping defective work pieces mainly utilizes a reject eye formed inside the die covering area on a substrate to automatically determine whether the skipping procedure is triggered or not. The method of the present invention comprises the steps of: finding and aligning the die eye of the die as well as the lead eye of the substrate; finding the reject eye when the die eye and the lead eye is evaluated as not being present; stopping the wire bonding operation and skipping to next work piece when the reject eye is located. The method of present invention is capable of automatically determining whether the skipping procedure is triggered or not thereby reducing operating down time and increasing throughput.

13 Claims, 6 Drawing Sheets

METHOD OF AUTOMATICALLY IDENTIFYING AND SKIPPING DEFECTIVE WORK PIECES FOR WIRE-BONDING OPERATION

BACKGROUND OF THE INVENTION

1. Field of the Invention

This invention relates to a wire bonding process for use in forming a substrate based package and, more particularly, to a wire bonding process equipped with a function of automatically skipping defective work pieces.

2. Description of the Related Art

Conventional substrate based packages such as the plastic BGA package 100 (see FIG. 1) typically comprises a substrate 110 having a die covering area 112 (referring to FIG. 2) on the upper surface thereof and a die 120 disposed on the die covering area 112. The upper surface of the substrate 110 is provided with a paddle 114 and a plurality of conductive traces 116 around the paddle 114 (see FIG. 2). Referring to FIG. 2, the die covering area 112 is defined inside the paddle 114 and the distance from the boundary of the die covering area 112 to the boundary of the paddle 114 is about 15 mils. It is noted that when die 120 is mounted to the paddle 114 of the substrate 110, the die covering area 112 will be entirely covered by the die 120.

Referring to FIG. 1 and FIG. 2, the active surface of the die 120 is provided with a plurality of bonding pads connected to the conductive traces 116 of the substrate 110 through a plurality of bonding wires 124. The lower surface of the substrate 110 is provided with a plurality of solder pads 118 electrically connected to corresponding conductive traces 116. Each solder pad 118 is provided with a solder ball 130 for making external electrical connection. The paddle 114, the conductive traces 116 and the solder pads 118 are usually made of metal with good electrical conductivity such as copper.

Typically, the substrate 110 is provided with a layer of solder mask 110a covering the surface thereof wherein lead fingers 117 of the conductive traces 116 adapted for connecting to the bonding wires 124 and the solder pads 118 are exposed from the solder mask 110a. In addition, the paddle 114 typically has some portions exposed from the solder mask 110a so as to form a plurality of thermal pads 113 used for heat transfer. Further, the upper surface of the substrate 110 is usually provided with several lead eyes 119 disposed outside the die covering area 112 wherein the lead eyes 119 are also exposed from the solder mask 110a. All of the surfaces of the thermal pads 113, the lead fingers 117, the solder pads 118, and the lead eyes 119 are plated with a layer of gold or palladium for preventing oxidation and increasing bondability.

In production, it is desirable to integrally form a plurality of substrates in a strip (typically referred to as a "substrate strip") having alignment holes so that the packaging process can be automated. In a conventional packaging process, the die 120 is attached to the die covering area 112 on the paddle 114. Then, during a wire bonding operation, the bond wires 124 are connected to the bonding pads on the die 120 and the lead fingers 117 on the substrate 110. Finally, the dies 120, bonding wires 124, and a portion of the substrate 110 including majority of the conductive traces 116 are encapsulated in a package body 140. The present invention is directed to the wire bonding operation.

FIG. 3 shows a wire bonder with a substrate strip 200 installed therein illustrating conventional wire bonding operation. Usually, defective substrates of the substrate strip 200 are marked with white ink 210 so that defective substrates can be distinguished from other normal substrates. Therefore, only normal substrates of the substrate strip 200 have dies 120 mounted thereon. On the contrary, defective substrates are just dispensed with precise amount of epoxy but without dies 120 placed thereon. When the substrate strip 200 is indexed to properly position each die 120 under a bond head 220, a camera (not shown), integrated into the bond head 220 and connected to a recognition system (not shown), will try to find and align the reference structures such as the lead eye 119 on the substrate or the die eye formed on the active surface of the die. When a defective substrate with white ink 210 is indexed to the bond head 220, the wire bonder will emit an alarm to notify an operator because the camera cannot find the lead eye (masked by the white ink 210) and the die eye (no die placed thereon). Then the operator will check the wire bonder and trigger a procedure for skipping the defective substrate, i. e., indexing the next to-be-bonded substrate to the bond head and re-performing the wire bonding operation.

However, in the conventional wire bonding operation described above, skipping of defective work pieces has only been dealt with manually in the past, causing significant operating down time and reduction of throughput. Moreover, when (a) the solder mask 110a is imaged and developed not so precisely as to cover a portion of the lead eye on the substrate or (b) the die eye on the semiconductor die becomes faint, the contour of the lead eye or the die eye will change a little such that it is easy to evaluate the lead eye or the die eye as not being present. This will lead to a result that work pieces are not defective but still skipped from wire-bonding.

Therefore, the present invention seeks to provide a method of automatically identifying and skipping defective work pieces which overcomes, or at least reduces the above-mentioned problems of the prior art.

SUMMARY OF THE INVENTION

It is a primary object of the present invention to provide a method of automatically identifying and skipping defective work pieces from normal work pieces which utilizes a reject eye formed inside the die covering area on a substrate to automatically determine whether the skipping procedure is triggered or not thereby reducing operating down time and increasing throughput.

It is another object of the present invention to provide a substrate for use in packaging of a semiconductor die, the substrate comprising at least a reject eye formed inside the die covering area of a substrate. The reject eye is adapted to be identified by a recognition system which gives a signal of stopping a wire bonding operation and triggering a skipping procedure when the reject eye is located on condition that no semiconductor die is disposed on the die covering area of the substrate.

The method of automatically identifying and skipping defective work pieces from normal work pieces used in a wire bonding operation in accordance with the present invention comprises: (a) finding and aligning the die eye of the die as well as the lead eye of the substrate; (b1) proceeding the wire bonding operation when the die eye and the lead eye is located; (b2) finding the reject eye when the die eye and the lead eye is evaluated as not being present; (c1) stopping the wire bonding operation and skipping to next work piece when the reject eye is located; (c2) stopping the wire bonding process and notifying an operator when the reject eye is evaluated as not being present; (c2') re-finding and re-aligning the die eye of the die and the lead eye of the substrate when the reject eye is evaluated as not being present. The method of skipping defective work pieces of the present invention is capable of automatically determining whether the skipping procedure is triggered or not thereby reducing operating down time and increasing throughput.

The substrate for use in packaging of a semiconductor die in accordance with the present invention comprising a metal paddle disposed in the central region of the substrate a solder mask formed over the metal paddle wherein at least a portion of the metal paddle is exposed from the solder mask to form an irregular mark. The substrate has a die covering area defined inside the metal paddle for receiving a semiconductor die and an epoxy area adapted for epoxy to dispense thereon defined inside the die covering area wherein the irregular mark is located inside the die covering area but outside the epoxy area. The irregular mark can be set as an eye point (referred to as a "reject eye" in the present invention) capable of being located by a recognition system integrated inside a wire bonder. The recognition system will give a signal of stopping a wire bonding operation and triggering the skipping procedure when the reject eye is located on condition that no die is placed on the substrate. The reject eye in accordance with the present invention is set on the irregular mark formed from the exposed portions of the metal paddle. Therefore, even if the solder mask is imaged and developed not very precisely, the contour of the irregular mark will still remain the same thereby preventing misevaluating the reject eye as not being present and assuring wire-bonding of normal substrates.

BRIEF DESCRIPTION OF THE DRAWINGS

Other objects, advantages, and novel features of the invention will become more apparent from the following detailed description when taken in conjunction with the accompanying drawings.

DETAILED DESCRIPTION OF THE PREFERRED EMBODIMENT

Figure 1:
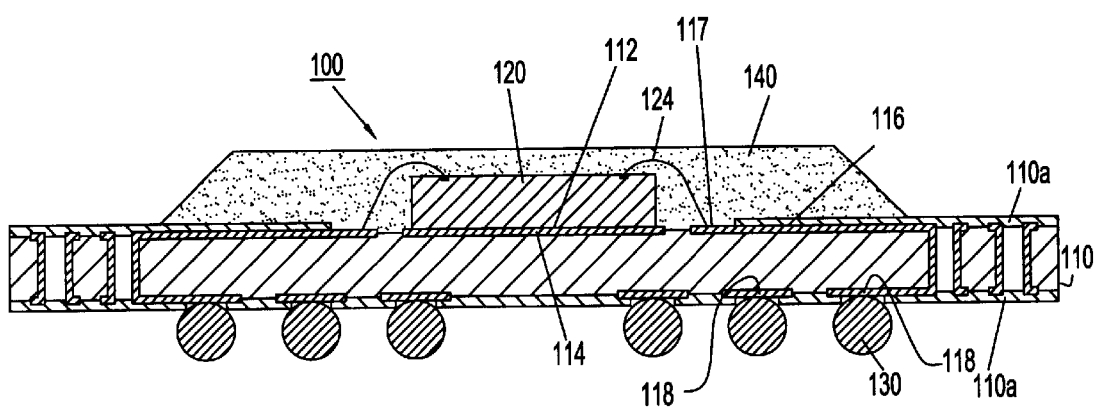
FIG. 1 is a cross sectional view of a conventional plastic BGA package.
Figure 2:
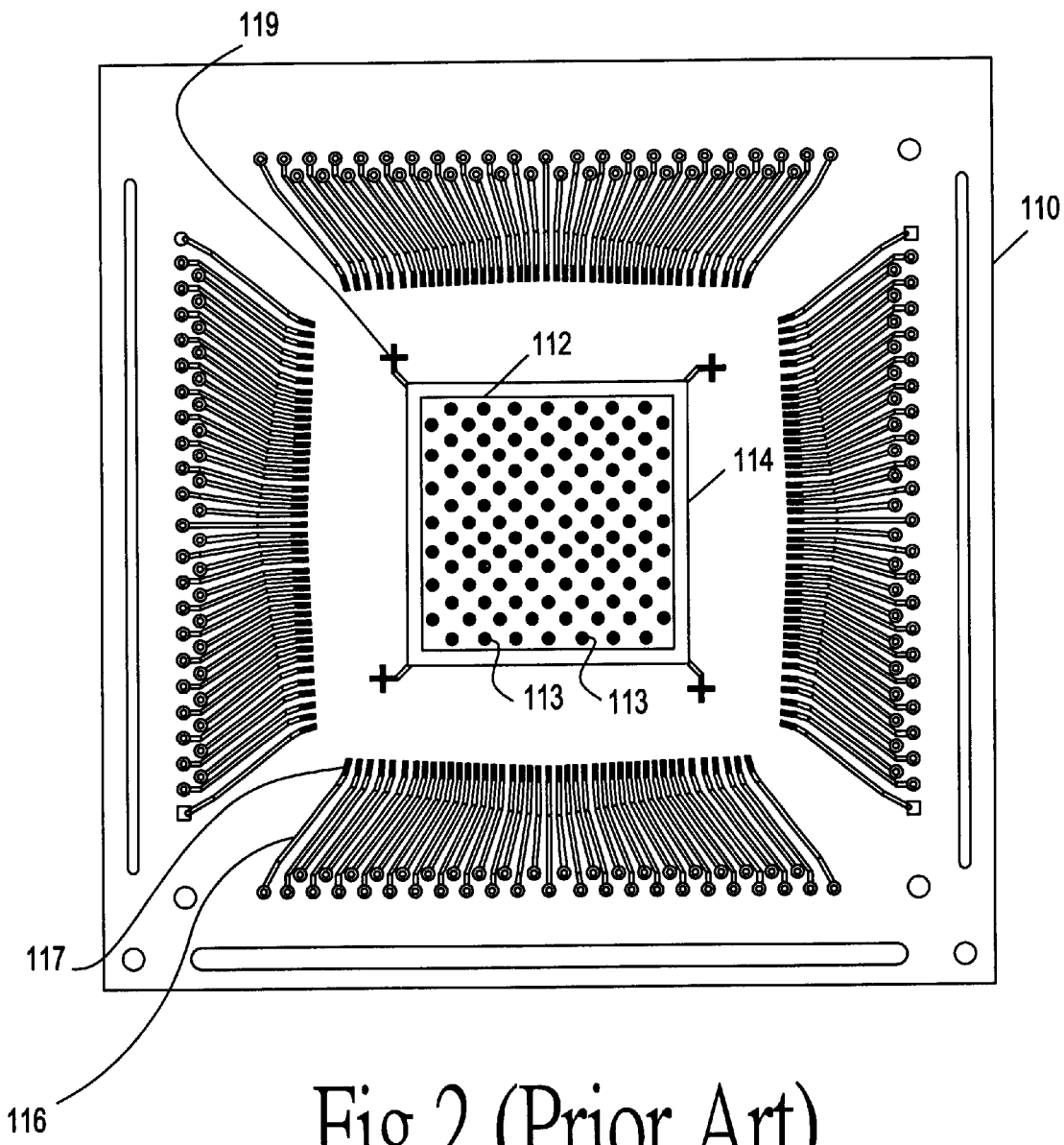
FIG. 2 is a top plan view of a substrate for use in the conventional package of FIG. 1.
Figure 3:
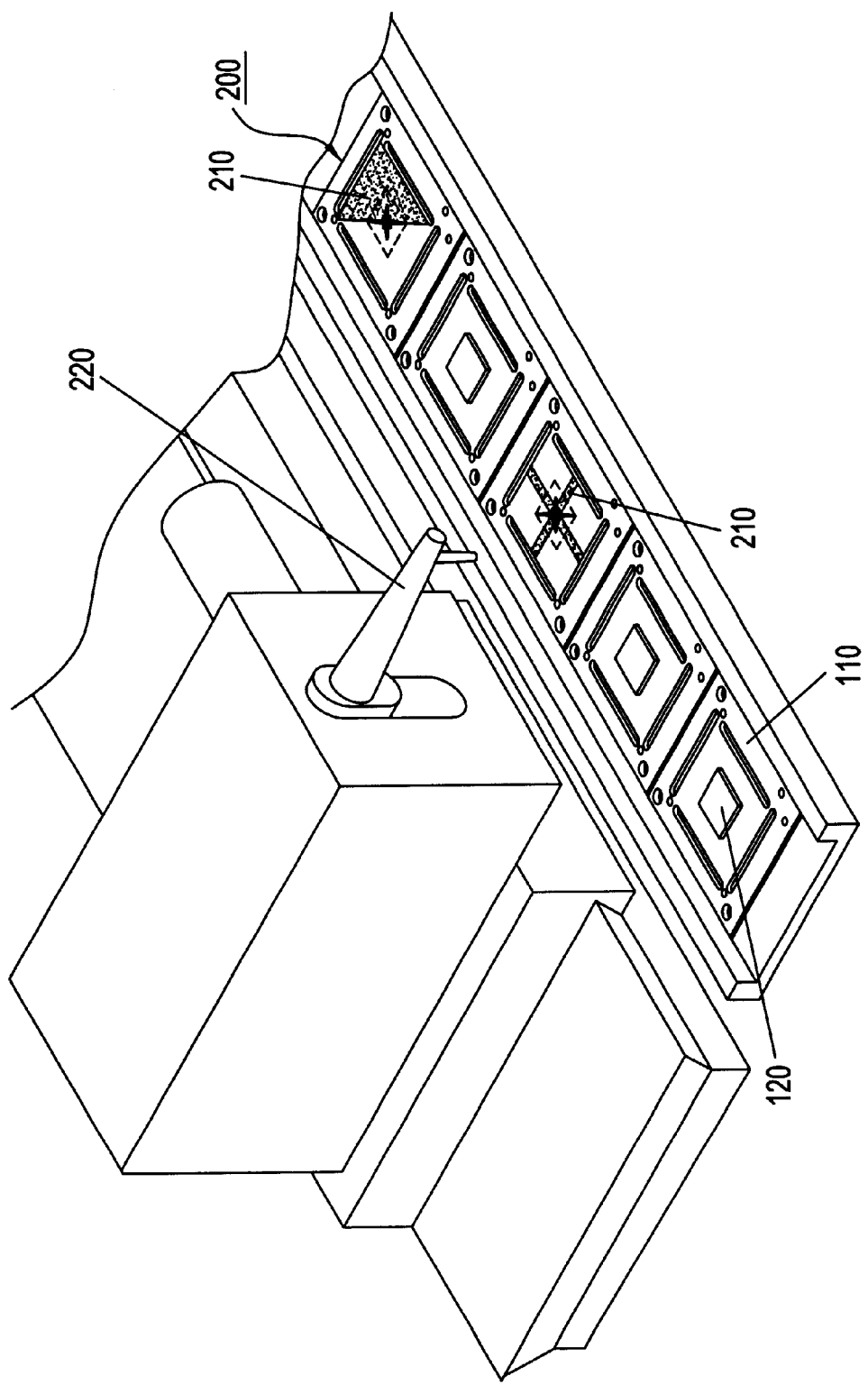
FIG. 3 is a schematic perspective view of a wire bonder with a substrate strip installed therein.
Figure 4:
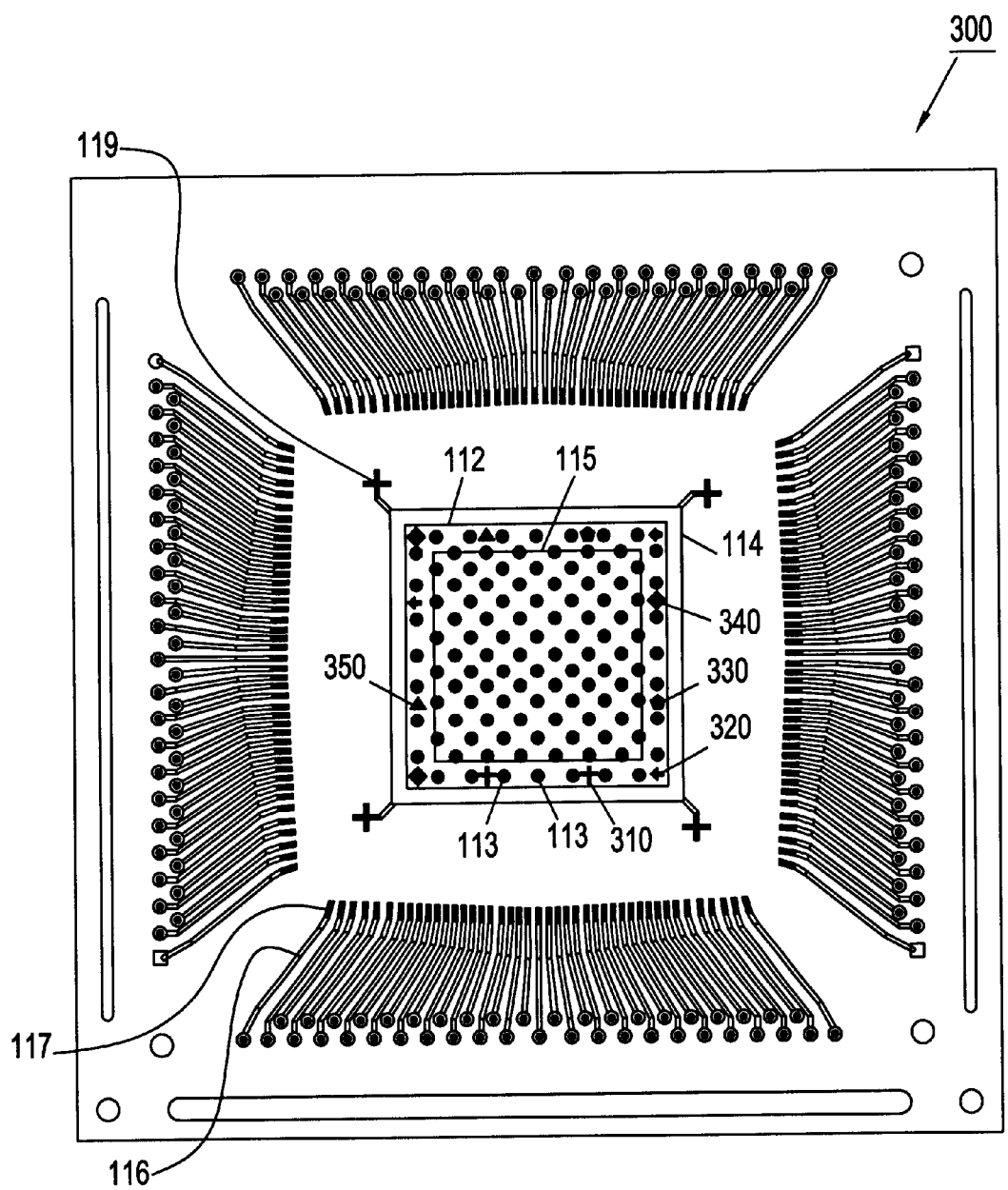
FIG. 4 is a top plan view of a substrate for use in packaging of a semiconductor die according to a first preferred embodiment of the present invention.

FIG. 4 discloses a substrate 300 for use in packaging of a semiconductor die according to a first preferred embodiment of the present invention. The upper surface of the substrate 300 is provided with a paddle 114 and a plurality of conductive traces 116 around the paddle 114. The substrate 300 has a die covering area 112 defined inside the paddle 114 for a semiconductor die to dispose thereon and a epoxy area 115 adapted for epoxy to dispense defined inside the die covering area 112. It is noted that when a semiconductor die is mounted to the substrate 300, the die covering area 112 is entirely covered by the die. In this embodiment, the boundaries of the die covering area 112 and the paddle 114 are spaced out about 20 mils apart, and the boundaries of the epoxy area 115 and the die covering area 112 are spaced out about 8 mils apart. The lower surface of the substrate 300 is provided with a plurality of solder pads (not shown) electrically connected to corresponding conductive traces 116. The paddle 114, the conductive traces 116 and the solder pads are usually made of metal with good electrical conductivity such as copper.

Figure 5:
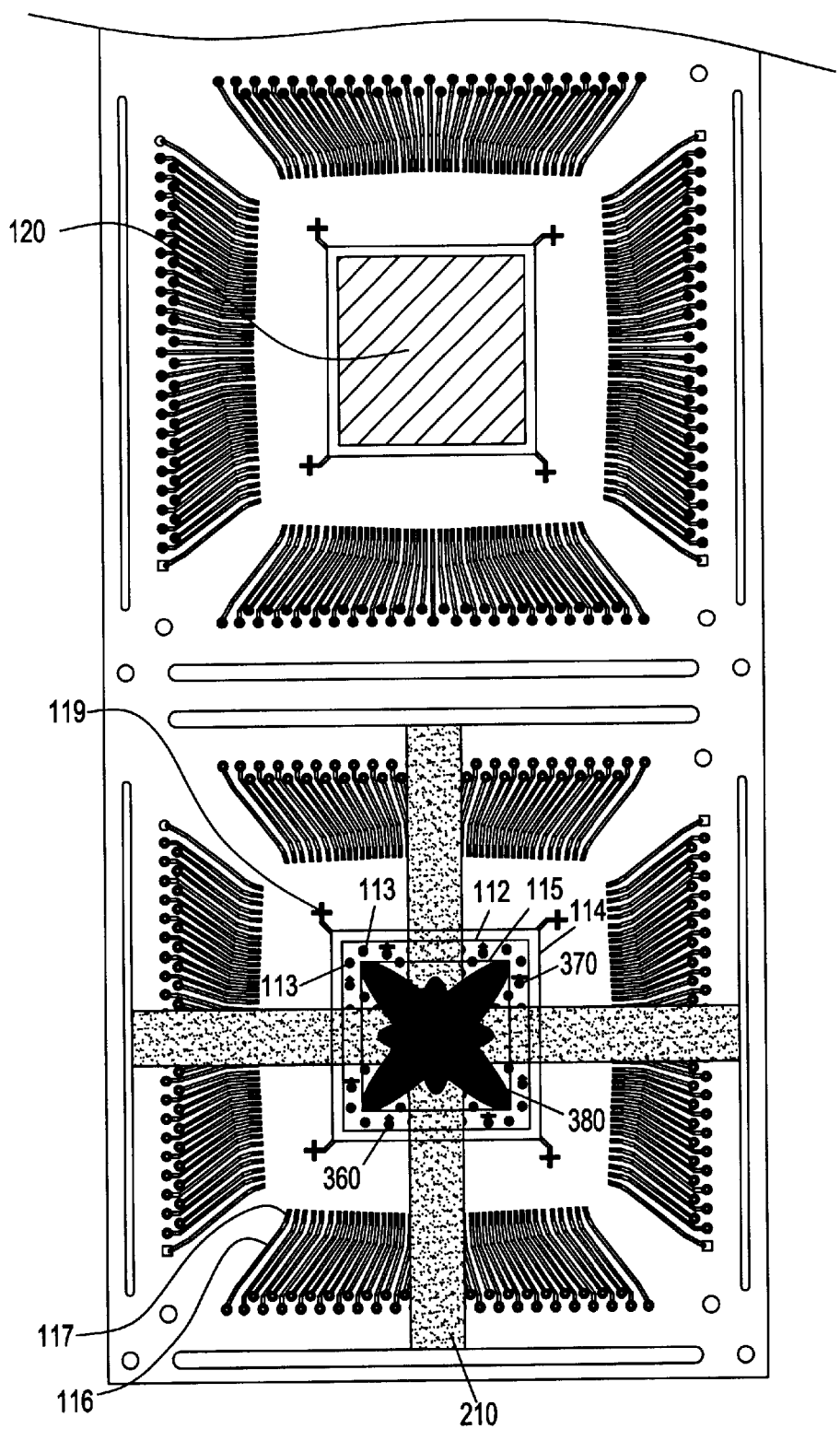
FIG. 5 is a top plan view of two substrates integrally formed in a strip according to a second preferred embodiment of the present invention after die bonding operation.

Referring to FIG. 4, the substrate of the present invention characterizes in that the paddle 114 has at least a portion exposed from the solder mask 110a to form an irregular mark. It should be understood that the irregular mark may take the form of any shape such as cross 310, arrow 320, pentagon 330, diamond 340, triangle 350, etc, illustrated in the FIG. 4. Alternatively, the irregular mark may be thermal pads with noncircular form illustrated as thermal pads 360, 370 in FIG. 5.

Conventional process for use in making a substrate comprises the steps of:
(a) laminating a conductive metal layer such as a copper foil with a roughed surface on both sides of a dielectric layer (suitable dielectric material such as fiberglass reinforced BT (bismaleimide-triazine) resin or FR-4 fiberglass reinforced epoxy resin) by conventional methods such as thermocompression; (b) forming vias and through-holes in the product of step (a) by any of a number of well-known techniques such as mechanical drilling or laser drilling, and then electroless plating the vias and through-holes with a layer of electrically conductive metal such as copper; (c) forming desired conductive traces or conductive regions, e.g., conductive traces 116, paddle 114, from the conductive metal layer on both sides of the substrate by photolithography and etching; (d) forming a photoimagable solder mask over the patterned surfaces of the substrate, transferred a predetermined pattern, and then developed in a manner that the thermal pads 113, lead fingers 117, solder pads 118 and lead eyes 119 are exposed from the solder mask; and (e) plating a material which allows a good bond to be formed with conventional material of bonding wires such as gold or palladium on exposed portions of the patterned conductive metal layer.

The irregular marks of the present invention can be formed using the conventional process described above without introducing any additional step. That is accomplished by transferring a predetermined pattern having the design of the irregular mark integrated therein and developing such that the paddle 114 has at least a portion exposed from the solder mask in the step (d), and plating a layer of gold or palladium on the exposed portion of the paddle 114 to form the irregular mark in the step (e).

In production, it is desirable to integrally form a plurality of substrates in a strip (typically referred to as a "substrate strip") having alignment holes so that the packaging process can be automated.

Referring to FIG. 5 again, defective substrates of a substrate strip are marked with white ink 210 so that defective substrates can be distinguished from other normal substrates. The white ink 210 on defective substrate is easy to be identified by a die bonder. Thus, after die bonding process, only normal substrates of the substrate strip have dies mounted thereon. On the contrary, defective substrates just have precise amount of epoxy 380 dispensed on the epoxy area 115 thereof but no dies placed thereon. Therefore, the irregular mark of the present invention is preferably formed inside the die covering area 112 but outside the epoxy area 115 so as to prevent the irregular mark from covering by epoxy 380.

The irregular mark of the present invention can be set as a reject eye capable of being located by a recognition system integrated inside a wire bonder to identify defective work pieces (i.e., defective substrate with white ink or normal substrate without die mounted thereon) from normal work pieces (i.e., normal substrate with die mounted thereon). Typically, field of view (FOV) of the recognition system of a wire bonder is quite limited (e.g., K&S 8028 OPTICS SYSTEM has a FOV of only 120×90 mil), hence white ink cannot be utilized as "eye point" to identify defective work piece. It is noted that the irregular mark of the present invention is not limited to the singular figures illustrated in the FIG. 4 and FIG. 5. Alternatively, the irregular mark may be any irregular pattern capable of being located within the teach box size and not repeated in the searching area of the recognition system. Using K&S 8028 as an example, the teach box size thereof is typically set as 15–60 mil square.

Figure 6:
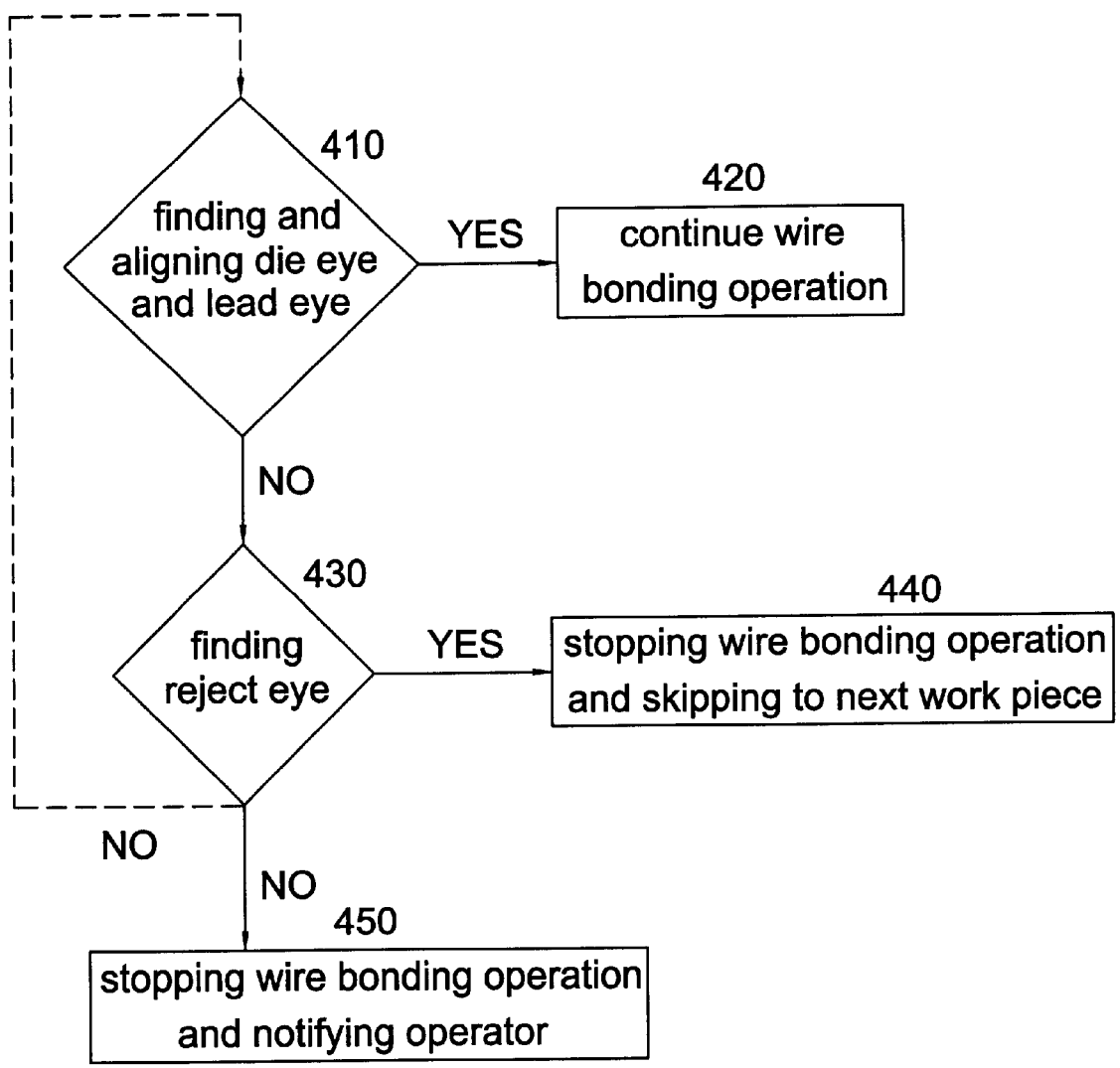
FIG. 6 is an overview flow diagram of a method of automatic identifying and skipping defective work pieces in accordance with the present invention.

FIG. 6 discloses an overview flow diagram of a method of automatic identifying and skipping defective work pieces in accordance with the present invention.

In step 410, when a normal work piece without white ink 210 (normal substrate with a die disposed thereon) is indexed to a proper position under a bond head, a camera integrated into the bond head will try to find and align the lead eye on the substrate and the die eye on the die. When the die eye and the lead eye are located, the process continues on to step 420, i.e., continuing the wire bonding operation. In step 420, a pattern recognition system provides all the coordinates (bonding pads on the die and lead fingers on the substrate) needed in the bonding process.

In step 410, when a defective work piece (i.e., defective substrate with white ink or normal substrate without die mounted thereon) is indexed to the bond head, the camera cannot find the lead eye (masked by the white ink 210) and/or the die eye (no die placed thereon), hence the process continues on to step 430, i.e., finding the reject eye. Since there is no die mounted on the substrate to cover the reject eye, the camera will locate the reject eye and the process continues on to step 440, i.e., stopping the wire bonding operation and skipping to next work piece that means indexing the next work piece to the bond head of the wire bonder.

In step 410, when a normal work piece (i.e., normal substrate with die mounted thereon) is under the situation that (a) the solder mask 110a is imaged and developed not so precisely as to cover a portion of the lead eye on the substrate or (b) the die eye on the semiconductor die becomes faint, the contour of the lead eye or the die eye will change a little such that it is easy to evaluate the lead eye or the die eye as not being present. That will make the process step 430, i.e., finding the reject eye. However, the die mounted thereon will cover the reject eye, hence the recognition system of the wire bonder cannot find the lead eye, then the process continues on to step 450, i.e., stopping the wire bonding process and notifying an operator. Alternatively, the process may continue back to step 410 whereby probability of misevaluation can be significantly reduced by re-finding and re-aligning the die eye of the die and the lead eye of the substrate. Therefore, the method of automatic identifying and skipping defective work pieces of the present invention has overcome or at least reduced the problem that work pieces are not defective but still skipped from wire-bonding due to variations in the contour of the lead eye or the die eye.

The method of skipping defective work pieces of the present invention is capable of automatically determining whether the skipping procedure is triggered or not thereby reducing operating down time and increasing throughput. Further, the reject eye in accordance with the present invention is set on the irregular mark formed from the exposed portions of the metal paddle. Therefore, even if the solder mask is imaged and developed not very precisely, the contour of the irregular mark will still remain the same thereby preventing misevaluating the reject eye as not being present and assuring wire-bonding of normal substrates.

Although the invention has been explained in relation to its preferred embodiment, it is to be understood that many other possible modifications and variations can be made without departing from the spirit and scope of the invention as hereinafter claimed.

What is claimed is:

1. A method of automatic identifying and skipping defective work pieces when processing normal work pieces used in a wire bonding operation, each normal work piece including a substrate having a die covering area on a surface thereof and a die disposed on the die covering area, each defective work piece including the substrate but without the die, wherein the die is provided with at least a die eye formed thereon, each substrate is provided with at least a lead eye formed outside the die covering area and at least a reject eye formed inside the die covering area, the method comprising the steps of:

(a) finding and aligning the die eye of a die and the lead eye of a substrate; and (b) finding the reject eye of the substrate when the die eye and the lead eye are evaluated as not being present in step (a).

2. The method as claimed in claim 1, further comprising a step of stopping the wire bonding operation and skipping to another work piece when the reject eye is located in step (b).

3. The method as claimed in claim 1, further comprising a step of stopping the wire bonding operation and notifying an operator when the reject eye is evaluated as not being present in step (b).

4. The method as claimed in claim 1, further comprising the step of repeating step (a) to find and align the die eye of the die and the lead eye of the substrate when the reject eye is evaluated as not being present in step (b).

5. A substrate for use in packaging of a semiconductor die, the substrate having a die covering area on which the die is disposed, the substrate comprising at least a reject eye being formed entirely inside the die covering area and being capable of being located within the teach box size of a recognition system.

6. The substrate as claimed in claim 5, wherein the reject eye is in the shape of a cross.

7. The substrate as claimed in claim 5, wherein the substrate is one of a plurality of substrates formed in a strip configuration for use in forming a plurality of substrate-based packages.

8. The substrate as claimed in claim 5, wherein the substrate is a BGA substrate.

9. A substrate for use in packaging of a semiconductor die, the substrate comprising a metal paddle for receiving the semiconductor die and a solder mask formed over the metal paddle wherein at least a portion of the metal paddle is exposed from the solder mask to form an irregular mark, wherein the substrate has a die covering area defined inside the metal paddle and an epoxy area for receiving the semiconductor die and a solder mask formed over the metal paddle wherein at least a portion of the metal paddle is exposed from the solder mask to form an irregular mark, wherein the substrate has a die covering area defined inside the metal paddle and an epoxy area that is adapted for epoxy to dispense thereon and that is defined inside the die covering area, wherein the irregular mark is formed entirely inside the die covering area but outside the epoxy area.

10. The substrate as claimed in claim 9, wherein the irregular mark is adapted to be identified by a recognition system which gives a signal of stopping a wire bonding operation when the irregular mark is located on condition that no semiconductor die is disposed on the die covering area of the substrate.

11. The substrate as claimed in claim 9, wherein the irregular mark is in the shape of a cross.

12. The substrate as claimed in claim 9, wherein the substrate is one of a plurality of substrates formed in a strip configuration for use in forming a plurality of substrate-based packages.

13. The substrate as claimed in claim 9, wherein the substrate is a BGA substrate.

* * * * *